United States Patent
Kwon

(10) Patent No.: US 10,522,091 B2
(45) Date of Patent: Dec. 31, 2019

(54) ORGANIC LIGHT-EMITTING DIODE DISPLAY AND OPERATION METHOD THEREOF

(71) Applicant: LG DISPLAY CO., LTD., Seoul (KR)

(72) Inventor: Oh-Jong Kwon, Suwon-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/123,596

(22) Filed: Sep. 6, 2018

(65) Prior Publication Data
US 2019/0080653 A1 Mar. 14, 2019

(30) Foreign Application Priority Data
Sep. 8, 2017 (KR) .................. 10-2017-0115224

(51) Int. Cl.
G09G 3/3291 (2016.01)
H01L 27/32 (2006.01)
G09G 3/3233 (2016.01)

(52) U.S. Cl.
CPC ......... *G09G 3/3291* (2013.01); *G09G 3/3233* (2013.01); *H01L 27/3276* (2013.01); *G09G 2310/0264* (2013.01); *G09G 2310/08* (2013.01); *G09G 2330/021* (2013.01)

(58) Field of Classification Search
None
See application file for complete search history.

(56) References Cited

U.S. PATENT DOCUMENTS

| | | | | |
|---|---|---|---|---|
| 8,363,037 B2* | 1/2013 | Chen | ................. | G06F 1/24 315/226 |
| 2002/0041278 A1* | 4/2002 | Matsueda | ............... | G09G 3/20 345/204 |
| 2002/0140645 A1* | 10/2002 | Sato | ................... | G09G 3/3233 345/82 |
| 2007/0126724 A1* | 6/2007 | Huang | ................... | G09G 3/00 345/204 |
| 2009/0028280 A1* | 1/2009 | Yanagisawa | ........... | G09G 5/008 375/371 |
| 2012/0146982 A1* | 6/2012 | Ueno | .................. | G09G 3/3258 345/211 |
| 2014/0092144 A1* | 4/2014 | Kim | .................... | G09G 3/3233 345/690 |
| 2015/0379909 A1* | 12/2015 | Yu | ........................ | G09G 3/006 345/690 |

* cited by examiner

*Primary Examiner* — Duane N Taylor, Jr.
(74) *Attorney, Agent, or Firm* — Birch, Stewart, Kolasch & Birch, LLP

(57) ABSTRACT

An OLED display and an operation method thereof, which are capable of preventing malfunctions caused by the influence of external noise on an extended cable when a display panel is separated from a set part by a predetermined distance or longer, are discussed. The OLED display includes a timing controller embedded in the set part separated from the display module by a predetermined distance and configured to control a reset signal for cancelling a safety mode to be transmitted to the display module in order to prevent the safety mode from being abnormally maintained due to the influence of external noise on a cable used to connect the display module and the set part when the safety mode for displaying a black screen is executed, to thereby prevent the display from continuously executing the safety mode to consistently display the black screen.

9 Claims, 9 Drawing Sheets

| Case | Case | Serdes Txinput | | State | Operation Mode | |
|---|---|---|---|---|---|---|
| | | Vx1 Lock | EPI Lock_In | | AM | AM_out |
| 1 | O | H | H | Vx1 Recovery | O | O |
| 2 | O | H | L | BDP | X | X |
| 3 | O | L | H | Normal operation | X | X |
| 4 | O | L | L | BDP | X | X |
| 5 | X | Floating → H | Floating → H | The same as case 1 in case of CNT, open and Vx1 / EPI lock in Pull Up connection | O | O |

ORGANIC LIGHT-EMITTING DIODE DISPLAY AND OPERATION METHOD THEREOF

This application claims the priority benefit of Korean Patent Application No. 10-2017-0115224, filed on Sep. 8, 2017 in the Republic of Korea, which is hereby incorporated by reference as if fully set forth herein.

BACKGROUND OF THE INVENTION

Field of the Invention

The present invention relates to an organic light-emitting diode (OLED) display and an operation method thereof and, particularly, to an OLED display and an operation method thereof capable of preventing malfunctions caused by the effect of external noise on an extended cable when a display panel is separated from a set part by a predetermined distance or longer.

Discussion of the Related Art

An organic light-emitting diode display device is a display device having an organic light-emitting diode (OLED) which is a spontaneous light-emitting element included in a pixel. The OLED display device has lower power consumption than a liquid crystal display that requires a backlight, and can be manufactured thinner than the liquid crystal display. In addition, the OLED display device has advantages of a wide viewing angle and a high response speed. Process technology for the OLED display device has been developed to reach a large-screen mass production level and thus is extending the market while competing with liquid crystal displays.

An OLED display 1 according to a related art is configured, as shown in part (A) of FIG. 1. In another example, as shown in part (B) of FIG. 1, a display device having a display module 30 and a set part 10 which are separated from each other has recently been developed. Distinguished from display devices in which the display module includes a control circuit such as the OLED display 1, the set part 10 (instead of the display module 30) as shown in part (B) of FIG. 1 includes a control circuit and thus the thickness of the display module 30 can be reduced. A cable including a default cable 21 and an extended cable 22 connected thereto is used, as shown in part (B) of FIG. 1, as necessary.

In such a display device, the influence of external noise on the cable 20 can cause failures in communication between the set part 10 and the display module 30. When communications between the set part 10 and the display module 30 are disconnected due to external noise, encoding and decoding operations conforming to the high-bandwidth digital content protection (HDCP) standard are performed for protection of content between the set part 10 and the display module 30. Here, when external noise is consistently generated, communications cannot be resumed.

SUMMARY OF THE INVENTION

An object of the present invention is to provide an OLED display and an operation method thereof, which are capable of removing the influence of external noise on communication operations performed between a set part and a display module of the OLED display.

Another object of the present invention is to prevent malfunctions that can be generated due to a relatively long cable in a display device in which a display module is separated from a set part.

Yet another object of the present invention is to shorten a time in which a user feels uncomfortable by consistently monitoring a communication state between the display module and the set part.

To accomplish the objects, an OLED display according to the present invention includes a display module, and a timing controller embedded in a set part separated from the display module by a predetermined distance and configured to control a reset signal for cancelling a safety mode to be transmitted to the display module in order to prevent the safety mode from being abnormally maintained due to the influence of external noise on a cable used to connect the display module and the set part when the safety mode for displaying a black screen is executed.

In the OLED display according to an example of the present invention, the timing controller can receive a pulse signal periodically generated by the display module and, when the pulse signal is not received from the display module for a set time, transmit a first reset signal to the display module.

In the OLED display according to an example of the present invention, the timing controller can receive information on the level of a voltage applied to OLEDs of the display module as a logic signal and, when the voltage applied to the OLEDs is a normal voltage ("H"), perform a normal operation.

In the OLED display according to an example of the present invention, the timing controller and the display module can perform encoding and decoding operations conforming to the high-bandwidth digital content protection (HDCP) standard for content protection when the safety mode is executed.

In the OLED display according to an example of the present invention, the timing controller can wait to receive a safety mode cancellation signal according to completion of the HDCP encoding and decoding operations from the display module and transmit a reset signal to the display module when a standby time has elapsed.

An operation method of an OLED display according to an example of the present invention includes receiving a pulse signal periodically generated by a display module; transmitting a first reset signal to the display module when the pulse signal is not received from the display module for a set time; receiving information on the level of a voltage applied to OLEDs of the display module as a logic signal and, when the voltage is a normal voltage ("H"), performing a normal operation; receiving a safety mode cancellation signal from the display module executing a safety mode for displaying a black screen according to the first reset signal; and transmitting a second reset signal to the display module when a time taken to receive the safety mode cancellation signal exceeds a set time due to the influence of external noise.

In the operation method of an OLED display according to an example of the present invention, the time set for execution of the safety mode can be set within a range of 5 to 10 seconds.

In the operation method of an OLED display according to an example of the present invention, the display module performs encoding and decoding operations conforming to the HDCP standard through communication with a set part for content protection when the safety mode is executed.

The OLED display according to the embodiment(s) of the present invention has the following advantages.

First, it is possible to prevent malfunctions that can be generated due to a relatively long cable in a display device in which a display module is separated from a set part.

Second, it is possible to remove the influence of external noise during a communication between a set part and a display module.

Third, it is possible to shorten a time in which a user feels uncomfortable by consistently monitoring a communication state between the display module and the set part.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a table showing BDP detection and safety mode entry conditions in the OLED display according to an embodiment of the present invention.

DETAILED DESCRIPTION OF THE EMBODIMENTS

Figure 1:
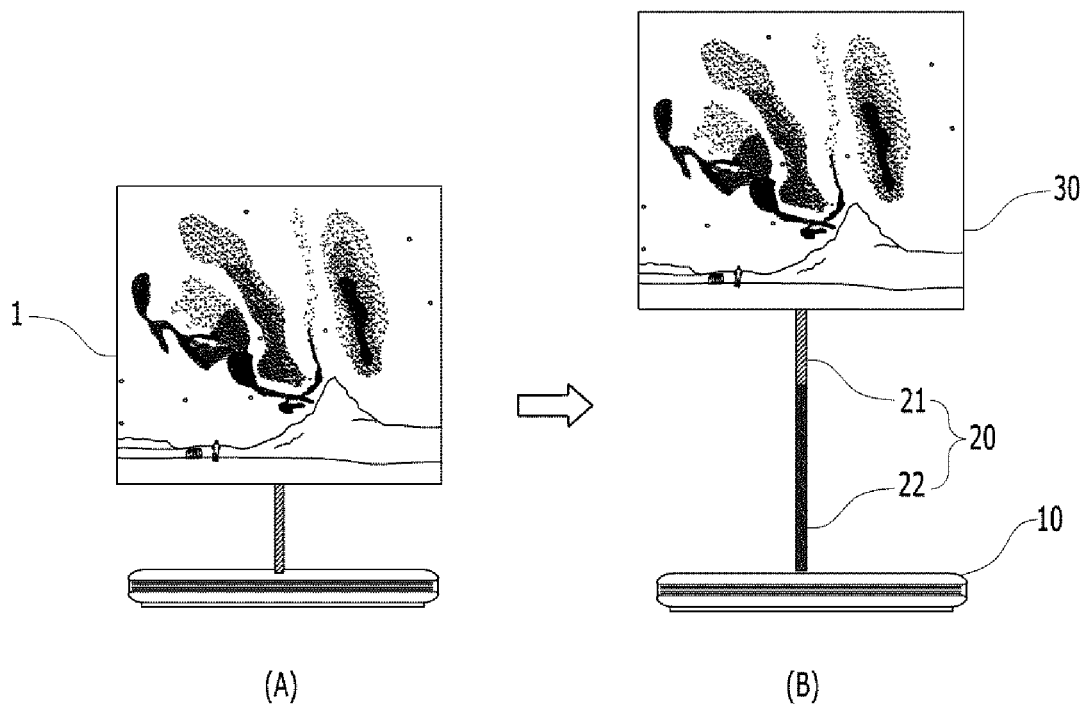
FIG. 1 is a diagram illustrating an OLED display (part (A)) and a display having a display module and a set part which are separated from each other (part (B)) according to a related art.

Specific structural and functional descriptions with respect to embodiments of the present invention disclosed below are for the purpose of explaining the embodiments of the present invention, and the present invention can be embodied in various forms and is not limited to the embodiments described below.

The present invention can be modified in various ways and embodied in many alternate forms. Accordingly, while the embodiments are susceptible to various modifications and alternative forms, specific embodiments thereof are shown by way of example in the drawings and will herein be described in detail. It should be understood, however, that there is no intent to limit the embodiments to the particular forms disclosed, but on the contrary, the embodiments are to cover all modifications, equivalents, and alternatives falling within the spirit and scope of the disclosure.

Although terms such as, for example, "first" and "second" can be used to describe various elements, the elements should not be limited by these terms. These terms are merely used to distinguish the same or similar elements from each other. For example, a first element can be called a second component and, similarly, the second element can be called the first element without departing from the scope of the present invention.

When an element is "coupled" or "connected" to another element, it should be understood that a third element can be present between the two elements although the element can be directly coupled or connected to the other element. When an element is "directly coupled" or "directly connected" to another element, it should be understood that no element is present between the two elements. Other representations describing relationships between components, that is, "between", "directly between" or "adjacent to" and "directly adjacent to" should be understood in the same manner.

The terms used in the specification are for the purpose of describing specific embodiments and are not intended to limit the present invention. The singular forms are intended to include the plural forms as well unless the context clearly indicates otherwise. It will be further understood that the terms "comprises" or "includes" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments pertain. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Meanwhile, when a certain embodiment can be realized in a different manner, a function or an operation specified in a specific block can be executed in an order different from that specified in a flowchart. For example, two consecutive blocks can be simultaneously executed or can be executed in reverse depending on the related function or operation.

Hereinafter, preferred embodiments of the present invention will be described with reference to the attached drawings.

Figure 2:
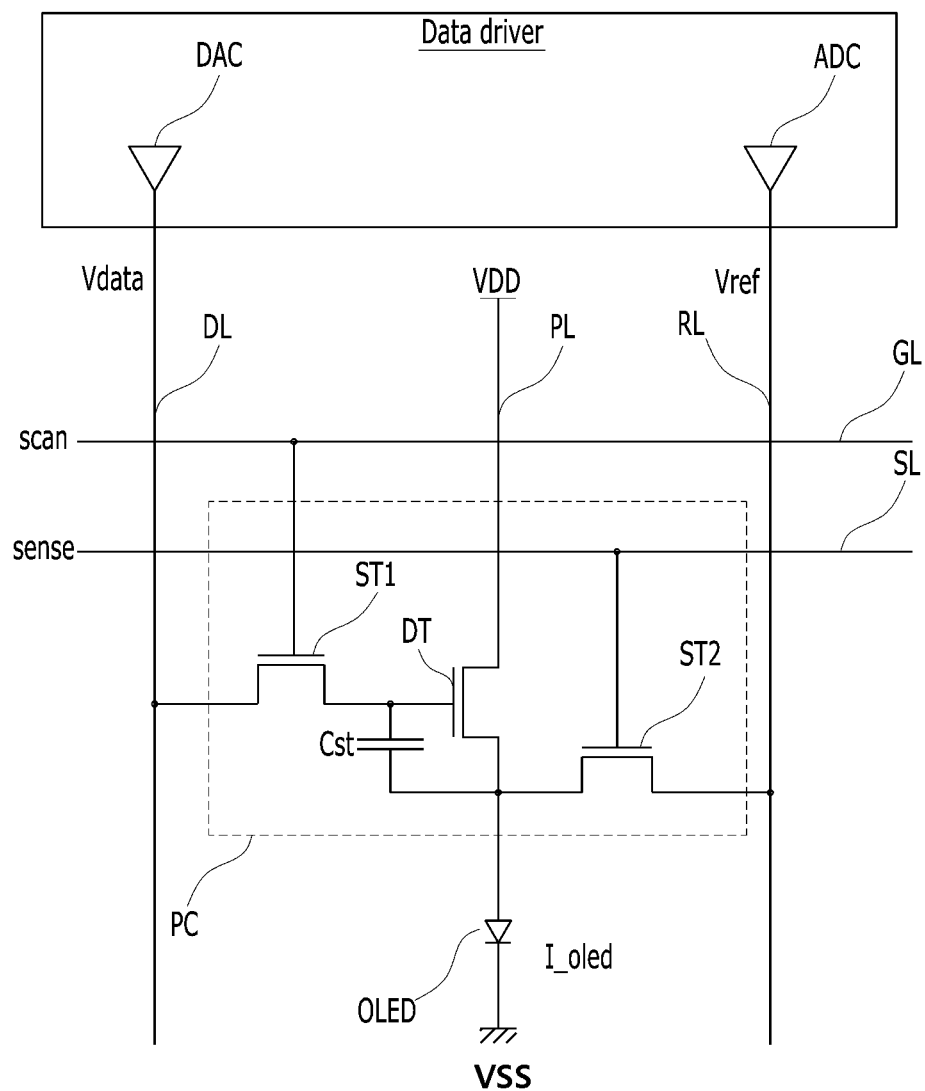
FIG. 2 is a circuit diagram for describing a pixel structure of an OLED display according to an embodiment of the present invention.

FIG. 2 is a circuit diagram for describing a pixel structure of an OLED display according to an embodiment of the present invention. All the components of the OLED display according to all embodiments of the present invention are operatively coupled and configured.

Referring to FIG. 2, each pixel of a display panel includes a first switching Thin Film Transistor (TFT) ST1, a second switching TFT ST2, a driving TFT DT, a capacitor Cst and an OLED.

The first switching TFT ST1 is switched by a scan signal scan (or gate signal) applied to a gate line GL to provide a data voltage Vdata applied to a data line DL to the driving TFT DT.

The driving TFT DT is switched by the data voltage Vdata supplied from the first switching TFT ST 1 to control a data current Ioled which flows from a first driving power VDD provided to a power line PL to the OLED.

The capacitor Cst is connected between the gate and the source of the driving TFT DT to store the data voltage Vdata supplied to the gate of the driving TFT DT and turns on the driving TFT DT using the stored voltage.

Each pixel includes a sensing signal line SL formed in the same direction as the gate line GL. The second switching TFT ST2 is switched by a sense signal sense applied to the sensing signal line SL to provide the data current Ioled supplied to the OLED to an analog-to-digital converter ADC of a drive IC.

The OLED is electrically connected between the source of the driving TFT DT and cathode power VSS and emits light according to the data current Ioled supplied from the driving TFT DT.

Each pixel of the OLED display displays a predetermined image by controlling the magnitude of the data current Ioled flowing from the first driving power VDD to the OLED using switching of the driving TFT DT according to the data voltage Vdata to cause the OLED to emit light.

Figure 3:
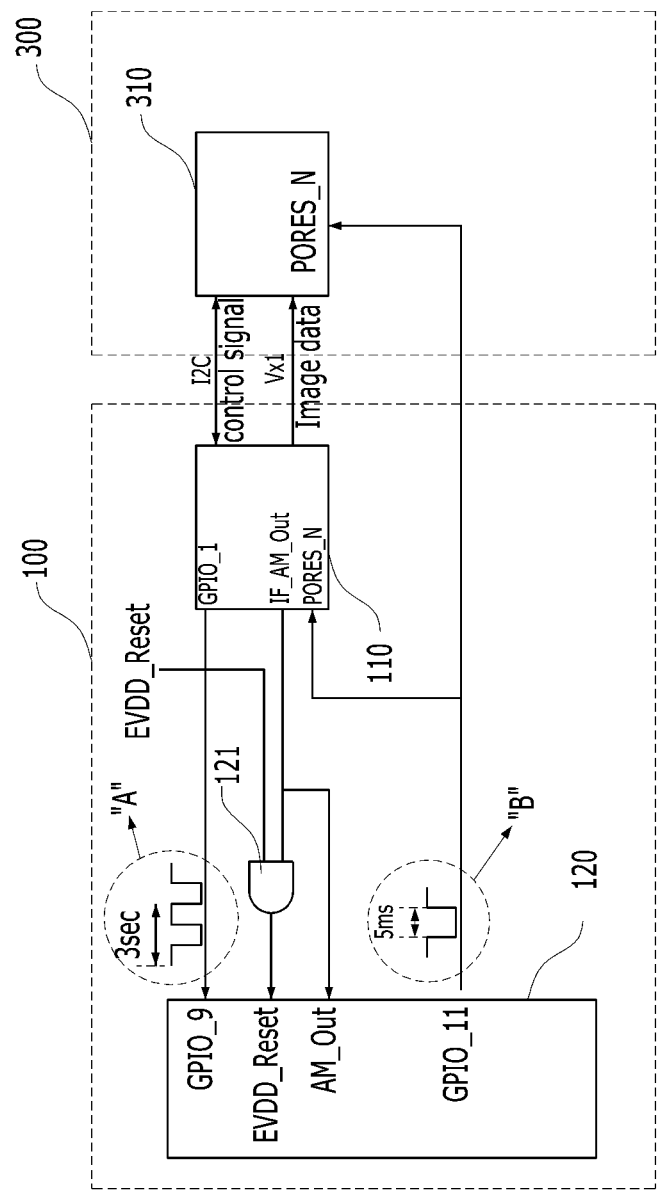
FIG. 3 is a diagram illustrating a configuration and an operation state for communication between a display module and a set part of the OLED display according to an embodiment of the present invention.

FIG. 3 is a diagram illustrating a configuration and an operation state for communication between a display module and a set part of the OLED display according to the embodiment of the present invention. As shown in FIG. 3, the OLED display includes a set part 100 including a serializer/deserializer (serdes) transceiver 110 and a timing controller (indicated by "T-con" in some drawings) 120, and a display module 300 including a serializer/deserializer (serdes) transceiver 310.

The timing controller 120 is embedded in the set part 100 separated from the display module 300 by a predetermined distance and controls a reset signal for cancelling a safety mode to be transmitted to the display module 300 in order to prevent the safety mode from being abnormally maintained due to the influence of external noise on a cable which connects the display module 300 and the set part 100 when the safety mode for displaying a black screen is executed.

The serdes transmitter 110 of the set part 100 can check whether the display module 300 performs a normal operation through data communication I2C with the serdes transceiver 310 of the display module 300. The serdes transceiver 110 of the set part 100 periodically outputs a pulse "A" through a terminal GPIO_1 in order to transfer a status signal indicating that the normal operation is being performed. This signal is referred to as a "heart beat pulse". The timing controller 120 receives the pulse "A" periodically output from the serdes transceiver 110 through a terminal GPIO_9.

If the pulse is not received from the serdes transmitter 110 for a set time period (e.g., "three seconds") the timing controller 120 transmits a first reset signal "B" to the serdes transceiver 110 and the serdes transceiver 310 of the display module 300 through a terminal GPIO_11. The first reset signal "B" can be output having a predetermined pulse width. For example, the first reset signal "B" can be output having a pulse width of about 5 ms. The first reset signal "B" is transferred to power reset terminals PORES_N of the serdes transceiver 110 of the set part 100 and the serdes transceiver 310 of the display module 300. When a negative signal is applied to the power reset terminals PORES_N, the serdes transceiver 110 and the serdes transceiver 310 are reset and re-driven.

In addition, the timing controller 120 receives information on the level of a voltage applied to OLEDs of the display module as a logic signal. That is, the timing controller 120 determines whether a driving voltage EVDD applied to the OLEDs of pixels of the display panel is normally provided. When the driving voltage applied to the OLEDs is a normal voltage "H", the display panel normally operates. When the display panel abnormally operates, the display module 300 outputs a low signal "L" while displaying a black screen.

When a predetermined safety issue occurs, the display module 300 enters a safety mode "AM" and displays a black screen through the panel. Entry into the safety mode will be described in detail below. Here, the serdes transceiver 110 outputs a low signal "L" through a terminal IF_AM_out. When safety mode cancellation conditions are satisfied, the serdes transceiver 110 outputs a high signal "H" through the terminal IF_AM_out.

An "EVDD_reset" signal and the signal output from the terminal IF_AM_Out of the serdes transceiver 110 are transferred to an AND gate 121. The AND gate 121 outputs a logic signal according to the signals applied to two terminals thereof. The logic signal of the AND gate 121 is transferred to a terminal EVDD_Reset of the timing controller 120. When the logic signal of the AND gate 121 is a high signal "H", the timing controller 120 switches to a normal output mode to normally drive the OLEDs.

When the safety mode cancellation conditions are satisfied, the high signal "H" output through the terminal IF_A-M_Out included in the serdes transceiver 110 is also applied to a terminal AM_out of the timing controller 120.

FIG. 4 is a table showing BDP detection and safety mode entry conditions in the OLED display according to the present invention. The table shows state determination in various cases (case 1 to case 5) and operation states depending thereon. Case 1 to case 4 correspond to a state in which a cable is connected between the display module 300 and the set part 100, and case 5 corresponds to a state in which a cable is not connected between the display module 300 and the set part 100.

As described above, the OLED display according to an example of the present invention is a display device in which the display module 300 is separated from the set part 100 by a predetermined distance or longer. Accordingly, the cable which connects the display module 300 and the set part 100 is exposed to the outside in most environments in which the display device is used. Since a high voltage is transmitted through the cable exposed to the outside, the "safety mode AN" is applied in order to prevent the display from being damaged. For example, case 5 is a case in which both a Vx1 Lock signal and an EPI Lock_In signal, which are applied to the serdes transceiver 311 of the display module 300 when the cable is not connected, are a high signal "H".

As described above, when a user touches terminals in a state in which a high voltage supplied from the set part 100 to the display module 300 is exposed when the cable is not connected, there is a risk of electric accident. Accordingly, the display device can operate in the "safety mode" in which power supplied from the set part 100 to the display module 300 is cut in consideration of states such as connection of the cable.

In the safety mode, the timing controller and the display module perform encoding and decoding operations conforming to the high-bandwidth digital content protection (HDCP) standard in order to protect content while the display module 300 displays a black screen.

The Vx1 Lock signal represents a communication state between the serdes transceiver 110 of the set part 100 and the serdes transceiver 310 of the display module 300. That is, the Vx1 Lock signal indicates a data bit for checking signals transmitted and received through the cable connecting the display module 300 and the set part 100. A Vx1 Lock state indicates a normal operation when it is a low signal "L" and indicates that a problem occurs in communication between the serdes transceiver 110 of the set part 100 and the serdes transceiver 310 of the display module 300 when it is a high signal "H".

The EPI Lock_In signal is a signal for checking data transmission and reception operations of a drive IC which drives the pixels of the display panel. That is, this signal represents a communication state between a source drive IC (331 in FIG. 5) connected to the display panel and the serdes transceiver 310 of the display module 300. That is, the EPI Lock_In signal represents that the source drive IC of the display module 300 has a problem when it is a low signal "L" and represents that the source drive IC of the display module 300 normally operates when it is a high signal "H".

Accordingly, case 1 corresponds to a case in which both the Vx1 Lock signal and the EPI Lock_In signal applied to the serdes transceiver 110 of the set part 100 when the cable is connected are a high signal "H". That is, case 1 represents that a problem occurs in communication between the display module 300 and the set part 100 although the drive IC of the display module 300 normally operates. Here, the timing controller 120 of the set part 100 recognizes that Vx1 recovery is needed. Here, when the display module 300 operates in the safety mode and communication between the set part 100 and the display module 300 is resumed after lapse of a predetermined time, a safety mode cancellation signal AM_out is output to switch from the safety mode to the normal mode and thus the display module normally operates. If Vx1 is not recovered after Vx1 recovery is performed for a predetermined time, the safety mode cancellation signal AM_out is output.

In case 2 and case 4 in which the drive IC of the display module 300 performs an abnormal operation irrespective of the communication state (case 2: "H", case 4: "L") between the display module 300 and the set part 100 when the cable is connected therebetween, the timing controller 120 of the set part 100 recognizes the state as a BDP state. Various wires and circuit elements are arranged in the display panel of the OLED display. Such wires and circuit elements can electrically short circuit or open due to various factors such as introduction of particles and physical external force. When such panel defects are generated, the display panel can abnormally operate or display defects can be generated, and in severe cases, display panel burn-in can occur, causing a situation in which the display panel cannot be used.

The timing controller 120 determines that the display panel has a defect and cuts power supplied to the display module 300 upon determination of the "BDP" state. Here, the display module 300 does not enter the safety mode and thus the safety mode cancellation signal is not output.

When the display module 300 normally operates (case 3), the Vx1 Lock signal provided from the set part 100 is a low signal "L" and a high signal "H" from the source drive IC 331 of the display module 300 is applied to the serdes transceiver 110 of the set part 100 through the serdes transceiver 310 of the display module 300.

Figure 5:
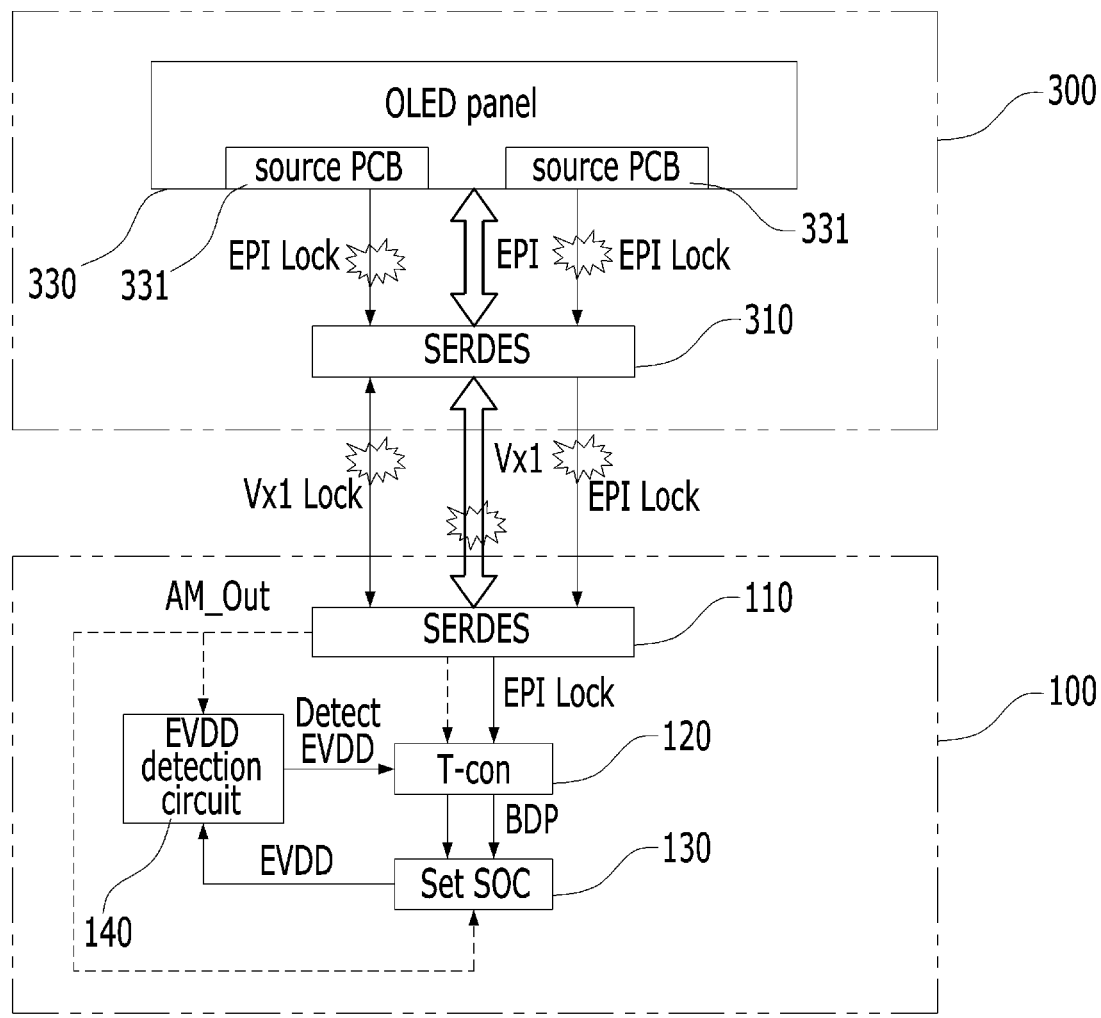
FIG. 5 is a diagram illustrating BDP detectable regions and signal processing when a BDP is detected in the OLED display according to an embodiment of the present invention.

FIG. 5 is a diagram illustrating BDP detectable regions and signal processing when a BDP is detected in the OLED display according to the present invention. As shown, regions in which burn-in, which causes abnormal operation due to a problem occurring in communication with respect to the display module or the set part, can be generated are as follows. A panel defect signal can be provided through an EPI Lock signal transmitted from the source drive circuit 331 connected to an OLED panel 330 to the serdes transceiver 310. This signal is transferred to the timing controller T-con 120 through the serdes transceiver 310 of the display module 300 and the serdes transceiver 110 of the set part 100. The timing controller 120 cuts power supplied to a system-on-chip Set SOC 130 of the set part 100 and provided to the display module 300.

When the serdes transceiver 110 of the set part 100 receives the AM_out signal, the AM_out signal is transferred to the system-on-chip Set SOC 130 and thus power off operation is performed without BDP counting.

Figure 6:
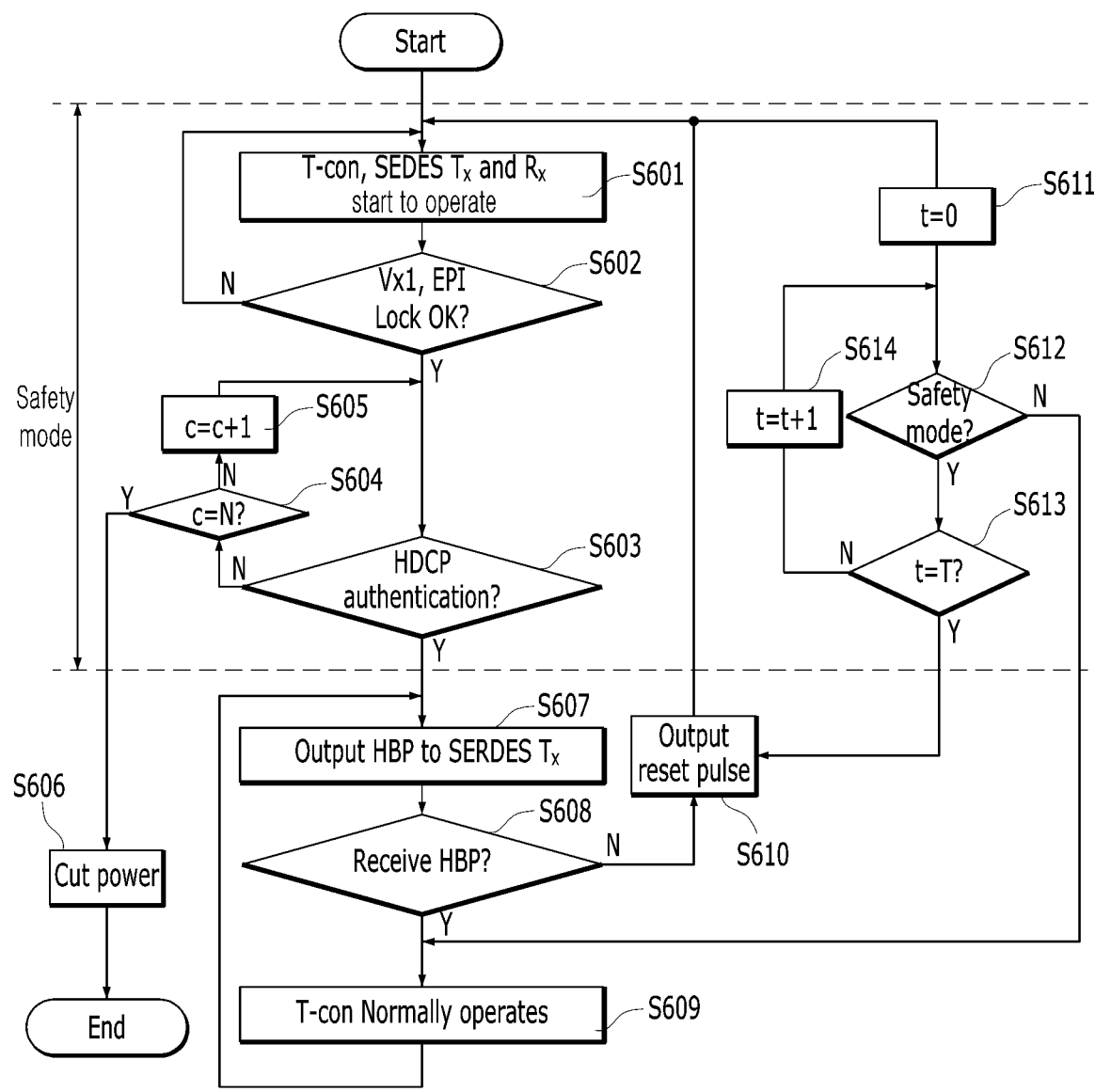
FIG. 6 is a flowchart illustrating a process of an operation method of the OLED display according to an embodiment of the present invention.

FIG. 6 is a flowchart illustrating a process of an operation method of the OLED display according to an embodiment of the present invention.

Referring to FIG. 6, when power is applied, the timing controller and the serdes Tx and Rx circuits start to operate (S601). When the cable is normally connected and a normal signal is received from the source drive IC (S602), the timing controller and the display module perform encoding and decoding operations conforming to the HDCP standard for content protection (S603).

Figure 7:
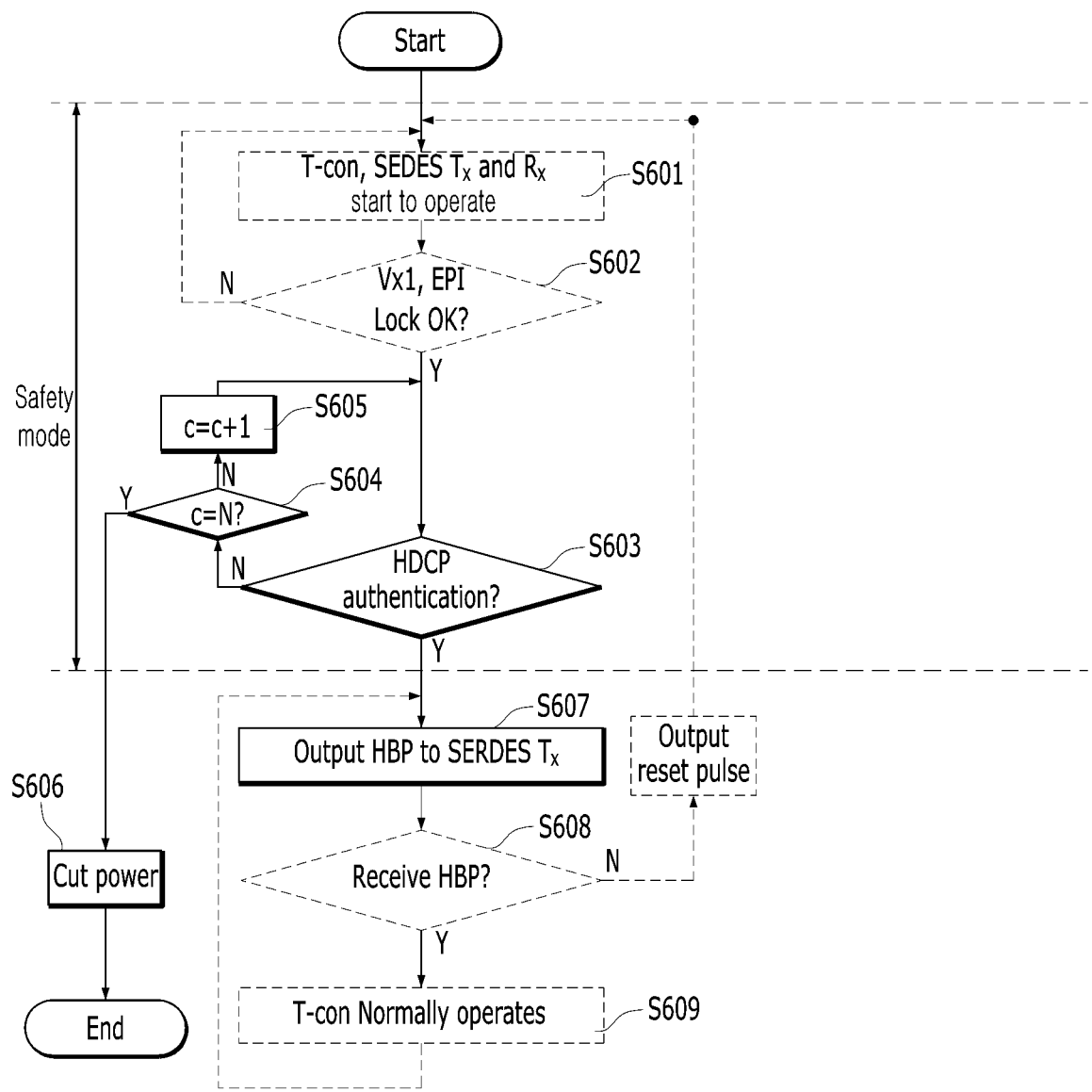
FIG. 7 is a flowchart illustrating an operation of a timing controller according to HDCP authentication in the operation method of the OLED display according to an embodiment of the present invention.

Here, when encoding and decoding fail although an authentication operation is performed up to "N" order to attempt N authentications (S604 and S605), as shown in FIG. 7, power off operation is performed (S606).

Figure 8:
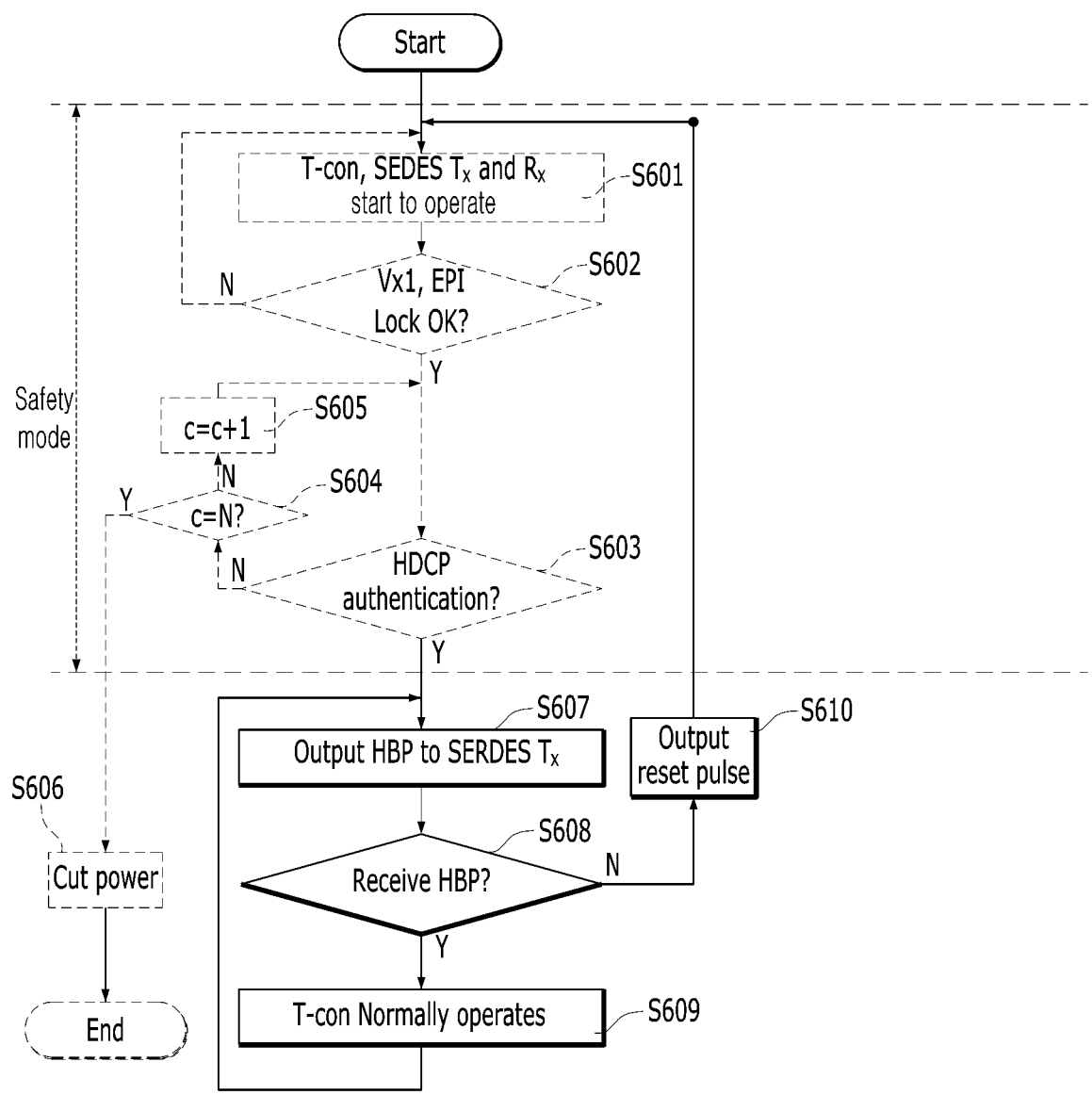
FIG. 8 is a flowchart illustrating an operation of the timing controller to monitor a pulse signal provided from a display module in the operation method of the OLED display according to an embodiment of the present invention.

FIG. 8 is a flowchart illustrating an operation of the timing controller to monitor a pulse signal provided from the display module in the operation method of the OLED display according to an embodiment of the present invention. Upon completion of HDCP authentication, the display module 300 periodically generates a pulse signal HBP (S607), as shown in FIG. 8. The timing controller 120 monitors the pulse signal from the display module in real time (S608) and normally operates upon reception of the pulse signal. Upon reception of a logical signal representing that an abnormal voltage is applied to the OLEDs, the timing controller controls a black screen to be displayed through the display module (S609).

If the pulse signal is not received from the display module, the timing controller transmits a reset signal to the display module. The timing controller 120 outputs a reset signal having a pulse width of 5 ms through the terminal GPIO_11 to reset the serdes transceiver 110 of the set part 100 and the serdes transceiver 310 of the display module 300 through the reset terminal RORES_N (S610).

Figure 9:
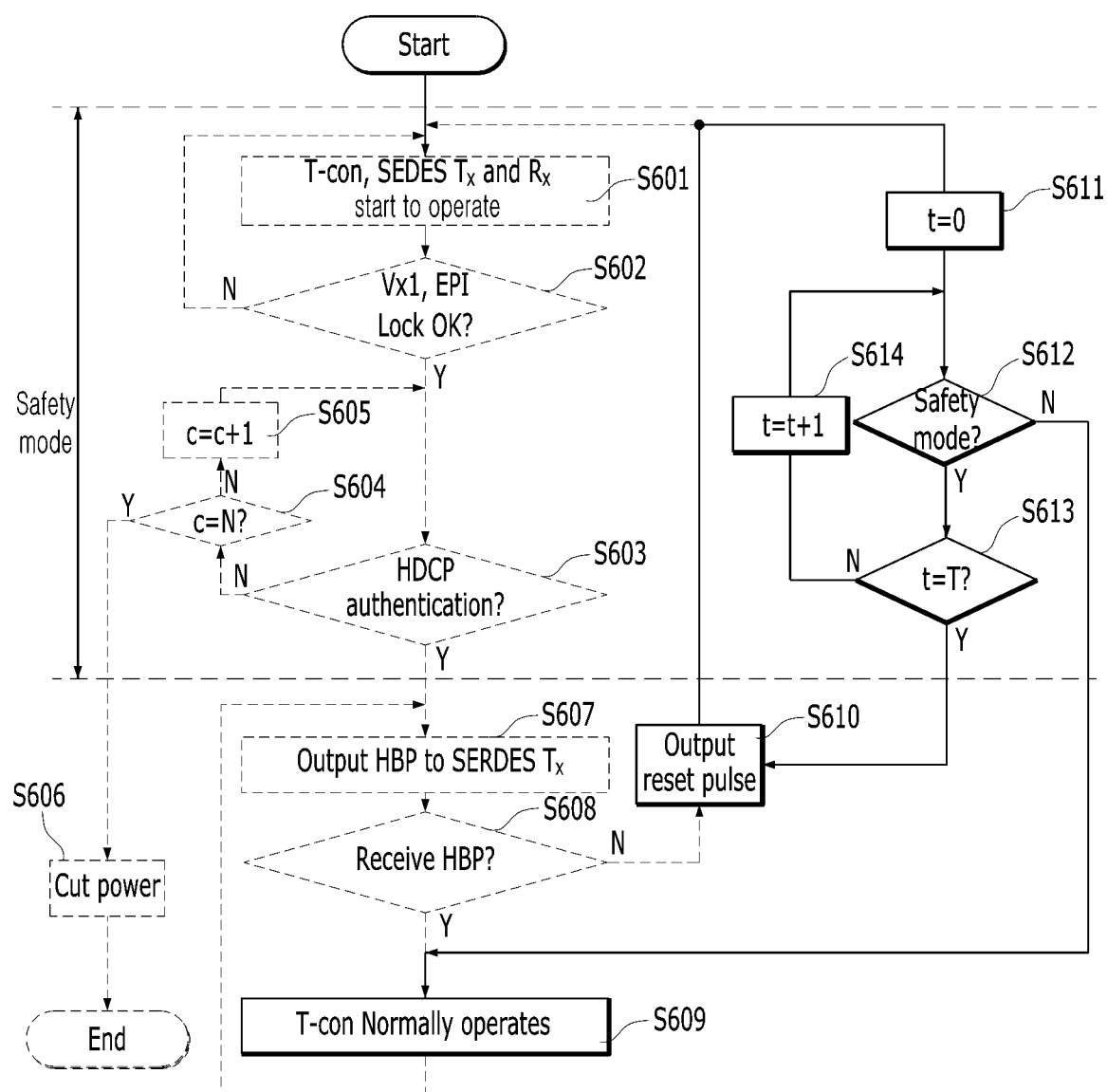
FIG. 9 is a flowchart illustrating an operation of the timing controller in a safety mode state according to an embodiment of the present invention.

FIG. 9 is a flowchart illustrating an operation of the timing controller in a safety mode state according to an embodiment of the present invention.

As described above with reference to FIG. 4, when the display device enters the safety mode and then the safety mode is cancelled after lapse of a predetermined time in case 1 and case 5, the display module 300 and the set part 100 need to perform normal operations. However, when a communication between the display module 300 and the set part 100 fails due to external noise, the display device cannot exit the safety mode. To address this problem, the present invention performs the following operation.

Referring to FIG. 9, when a reset pulse signal is output according to a control signal of the timing controller 120, the display module 300 displays a black screen in the safety mode. Here, the time t of a timer included in the timing controller is initialized (S611).

It is checked whether the display module is in the safety mode state while the timer increases the time t (S612). If the display module is not in the safety mode state, this means that the safety mode cancellation signal AM_out has been output, and the timer is initialized again.

The time t of the timer is compared with a set time "T" in a state in which the safety mode state is maintained (S613). A standby time set to wait for reception of the safety mode cancellation signal is within a range of 5 to 10 seconds, and an appropriate standby time is 6 seconds in preferred embodiments. However, the present invention is not limited thereto and the standby time can be changed according to environments in which the display is used.

If the safety mode cancellation signal is not received even when the set part time has elapsed, the timing controller 120 determines that external noise acts and outputs a reset pulse signal to reset the serdes transmitter 110 of the set part 100 and the serdes transceiver 310 of the display module 300 through the reset terminals PORES_N of the serdes transceiver 110 and the serdes transceiver 310 (S610).

Although preferred embodiments of the present invention have been described above, those skilled in the art will appreciate that various modifications and variations can be made in the present invention without departing from the spirit or scope of the present invention disclosed in the appended claims.

What is claimed is:

1. An organic light-emitting diode display comprising:
   a display module; and
   a timing controller embedded in a set part separated from the display module by a predetermined distance, and configured to control a reset signal for cancelling a safety mode to be transmitted to the display module in order to prevent the safety mode from being abnormally maintained due to an influence of external noise on a cable used to connect the display module and the set part when the safety mode for displaying a black screen is executed.

2. The organic light-emitting diode display according to claim 1, wherein the timing controller receives a pulse signal periodically generated by the display module, and when the pulse signal is not received from the display module for a set time, transmits a first reset signal to the display module.

3. The organic light-emitting diode display according to claim 2, wherein the timing controller receives information on a level of a voltage applied to organic light-emitting diodes of the display module as a logic signal and, when the voltage applied to the organic light-emitting diodes is a normal voltage, performs a normal operation.

4. The organic light-emitting diode display according to claim 1, wherein the timing controller and the display module perform encoding and decoding operations conforming to a high-bandwidth digital content protection standard for content protection when the safety mode is executed.

5. The organic light-emitting diode display according to claim 4, wherein the timing controller waits to receive a safety mode cancellation signal according to completion of the high-bandwidth digital content protection encoding and decoding operations from the display module and transmits a reset signal to the display module when a standby time has elapsed.

6. The organic light-emitting diode display according to claim 5, wherein the standby time set to wait for reception of the safety mode cancellation signal is set to be within a range of 5 to 10 seconds.

7. An operation method of an organic light-emitting diode display, the operation method comprising:
   receiving a pulse signal periodically generated by a display module;
   transmitting a first reset signal to the display module when the pulse signal is not received from the display module for a set time;
   receiving information on a level of a voltage applied to organic light-emitting diodes of the display module as a logic signal and, when the voltage is a normal voltage, performing a normal operation;
   receiving a safety mode cancellation signal from the display module executing a safety mode for displaying a black screen according to the first reset signal; and
   transmitting a second reset signal to the display module when a time taken to receive the safety mode cancellation signal exceeds a set time due to an influence of external noise.

8. The operation method according to claim 7, wherein the set time set for execution of the safety mode is set to be within a range of 5 to 10 seconds.

9. The operation method according to claim 7, wherein the display module performs encoding and decoding operations conforming to a high-bandwidth digital content protection standard through communication with a set part for content protection when the safety mode is executed.

* * * * *